United States Patent
Perez-Falcon et al.

(10) Patent No.: US 11,048,175 B2
(45) Date of Patent: Jun. 29, 2021

(54) APPARATUS FOR AND METHOD CLEANING A SUPPORT INSIDE A LITHOGRAPHY APPARATUS

(71) Applicant: ASML Holding N.V., Veldhoven (NL)

(72) Inventors: Victor Antonio Perez-Falcon, Bridgeport, CT (US); Michael Andrew Chieda, Easton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 16/642,927

(22) PCT Filed: Jul. 31, 2018

(86) PCT No.: PCT/EP2018/070653
§ 371 (c)(1),
(2) Date: Feb. 28, 2020

(87) PCT Pub. No.: WO2019/042682
PCT Pub. Date: Mar. 7, 2019

(65) Prior Publication Data
US 2020/0348606 A1    Nov. 5, 2020

Related U.S. Application Data

(60) Provisional application No. 62/550,785, filed on Aug. 28, 2017.

(51) Int. Cl.
*G03F 7/20* (2006.01)
(52) U.S. Cl.
CPC .......... *G03F 7/70708* (2013.01); *G03F 7/707* (2013.01); *G03F 7/70925* (2013.01)

(58) Field of Classification Search
CPC .. G03F 7/70708; G03F 7/70925; G03F 7/707; G03F 7/70733; G03F 7/70741;
(Continued)

(56) References Cited

U.S. PATENT DOCUMENTS 6,830,650 B2 * 12/2004 Roche ............... H01J 37/32935
118/712
2006/0236793 A1 * 10/2006 Hunter ............. H01L 21/67288
73/865.9

(Continued)

FOREIGN PATENT DOCUMENTS

EP          0790642 A2    8/1997
JP      2006013308 A  *  1/2006
(Continued)

OTHER PUBLICATIONS

English translation of JP2006-013308, published Jan. 12, 2006. (Year: 2006).*

(Continued)

*Primary Examiner* — Christina A Riddle
(74) *Attorney, Agent, or Firm* — Sterne, Kessler, Goldstein & Fox P.L.L.C.

(57) ABSTRACT

Methods and systems are described for cleaning a support such as a clamp of a chuck that holds a patterning device or a wafer in a lithographic apparatus. The method includes loading a electrostatic cleaning substrate into a lithographic apparatus. The electrostatic cleaning substrate includes at least one electrode. The method further includes bringing the electrostatic cleaning substrate near to the clamping surface to be cleaned and connecting the electrode to a voltage source. Particles present on the support are then transferred to the electrostatic cleaning substrate.

22 Claims, 7 Drawing Sheets

(58) Field of Classification Search
CPC .............. G03F 7/7075; G03F 7/70841; G03F 7/70858; G03F 7/70866; G03F 7/70908; G03F 7/70916; G03F 7/7095; G03F 7/70975; G03F 7/70991; G03F 7/7085; B08B 6/00; B08B 7/00; C23C 16/4407; Y10S 134/902; H01L 21/67; H01L 21/67005
USPC .............. 355/30, 52–55, 72–77; 134/1, 1.3; 250/492.1, 492.2, 492.22, 493.1, 504 R
See application file for complete search history.

(56) References Cited

U.S. PATENT DOCUMENTS

| | | | |
|---|---|---|---|
| 2008/0257383 A1* | 10/2008 | Levinson | H01L 21/02057 134/6 |
| 2010/0258144 A1 | 10/2010 | Broz et al. | |
| 2011/0037960 A1* | 2/2011 | Scaccabarozzi | G03F 7/70925 355/30 |
| 2013/0247935 A1 | 9/2013 | Park | |
| 2014/0268074 A1 | 9/2014 | Chien et al. | |
| 2017/0131638 A1* | 5/2017 | Kim | G03F 7/70933 |
| 2019/0155178 A1* | 5/2019 | Lin | G03F 7/7085 |
| 2020/0096881 A1* | 3/2020 | Van Duivenbode | B08B 6/00 |

FOREIGN PATENT DOCUMENTS

| | | | | |
|---|---|---|---|---|
| WO | WO-2013083332 A1 * | 6/2013 | ......... | G03F 7/70925 |
| WO | WO 2016/142370 A1 | 9/2016 | | |

OTHER PUBLICATIONS

International Search Report and Written Opinion of the International Searching Authority directed to related International Patent Application No. PCT/EP2018/070653, dated Nov. 23, 2018; 10 pages.

International Preliminary Report on Patentability directed to related International Patent Application No. PCT/EP2018/070653, dated Mar. 3, 2020; 7 pages.

* cited by examiner

APPARATUS FOR AND METHOD CLEANING A SUPPORT INSIDE A LITHOGRAPHY APPARATUS

CROSS-REFERENCE TO RELATED APPLICATIONS

This application claims priority of U.S. Provisional Patent Application No. 62/550,785, which was filed on Aug. 28, 2017, and which is incorporated herein in its entirety by reference.

FIELD

The present disclosure relates to methods and systems for cleaning a support such as a clamp of a chuck, e.g., an electrostatic chuck that is used to hold a device such as a reticle, mask, or wafer inside a lithography apparatus.

BACKGROUND

A lithographic apparatus is a machine that applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

In order to shorten the exposure wavelength and, thus, reduce the minimum printable size, it has been proposed to use an extreme ultraviolet (EUV) radiation source. EUV radiation is electromagnetic radiation having a wavelength within the range of about 5 nm to about 20 nm, for example within the range of about 13 nm to about 14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a small quantity of fuel, such as droplets of a suitable fuel material (e.g., tin) or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source.

An electrostatic chuck (ESC) used in a lithography apparatus to hold a patterning reticle on a scanning stage can become contaminated. This contamination can be transferred from the reticle to the ESC and vice versa. The contamination can also originate in the lithographic chamber itself. The contamination causes overlay error and therefore nonfunctional computer chip.

Typically, the ESC is manually cleaned. However, conventional manual cleaning methods leave a residue of very fine particles. The manual cleaning can remove only particles larger than approximately 3 µm in diameter. Also, manual cleaning requires the apparatus to be vented to atmospheric pressure and partially disassembled, which in turn causes loss of productivity.

The state of the art for cleaning an ESC in situ of the lithography tool is a manual solvent wipe with a special reduced particulate wiper. It is not possible to remove the ESC for ex situ traditional wet cleaning since it is electrically and mechanically into a monolithic machine component.

In semiconductor micro lithography, there are systems where the reticle is reflective and clamped to a surface. This clamp surface must be clean in order to obtain a reasonable yield in chip production. Thus, a user needs to be able to clean the clamp if it becomes contaminated.

SUMMARY

It is desirable to obviate or mitigate at least one of the problems, whether identified herein or elsewhere, or to provide an alternative to existing apparatus or methods.

According to one aspect there is disclosed an apparatus comprising a substrate configured to be supported by a first support structure, the substrate comprising at least one electrode configured to generate an electrostatic field between the at least one electrode and a confronting surface of a second support structure when the first support structure brings the surface of the substrate into spaced-apart apposition with the confronting surface of the second support structure and the at least one electrode is electrically connected to a voltage supply. The first support structure may be a wafer support or a reticle support. The second support structure may comprise a chuck and a clamp supported by the chuck. The voltage supply may be part of the substrate and may be a battery and a voltage converter. The substrate may include a switch for selectively connecting the electrode to the voltage supply. The at least one electrode may have a total area substantially the same as a total area of the confronting surface. The surface of the substrate in proximity to the confronting surface may be substantially planar. The confronting surface may have a nonplanar surface and the surface of the substrate in proximity to the confronting surface has a substantially complementary nonplanar surface. The substrate may comprise a layer of a material that is substantially nonconductive. The substrate may comprise a layer of a material that is substantially semiconductive. The substrate may have a layer of an adherent material on a surface of the substrate which confronts the confronting surface. The adherent material may be a polymeric material such as polyimide or a fluoropolymer.

According to another aspect there is disclosed a method of removing particles from a surface of a support within a lithographic apparatus, the method comprising the steps of positioning a substrate on a support structure, the substrate including at least one electrode, moving the support structure to a first position in which a surface of the substrate is moved into spaced-apart apposition with the surface of the support, cleaning the surface of the support by applying a voltage to the at least one electrode to generate an electrostatic field between the electrode and surface causing particles on the confronting surface to be attracted to the surface of the substrate, and moving the support structure to a second position in which a surface of the substrate is moved away from the surface of the support. The surface of the substrate may be provided with a layer of an adherent material and the step of cleaning the surface by applying a voltage to the electrode to generate an electrostatic field between the at least one electrode and surface may comprise causing particles on the confronting surface to be attracted to the layer of adherent material. The adherent material may be a polymeric material which may be polyimide or a fluoropolymer. Each of the moving steps may be automated. The support structure may comprise a wafer support or the support structure may comprise a reticle support. The support structure may comprise an electrostatic chuck, and the method may not include a step of applying a voltage to the electrostatic chuck to secure the substrate to the electrostatic chuck. The substrate may have substantially the same total surface area as surface facing the surface of the support.

According to another aspect there is disclosed a lithographic apparatus comprising a chamber, a positioning device configured and arranged to move an object placed on the positioning device into and out of the chamber, a support structure positioned within the chamber, a substrate placed on the positioning device and arranged such that the positioning device can move the substrate along a path including a first position in which the substrate is outside of the chamber and a second position in which a surface of the substrate is positioned adjacent a surface of the support structure, the substrate including at least one electrode, and a voltage supply arranged to supply voltage to the at least one electrode when the substrate is in the second position. The substrate may comprise the voltage supply. The voltage supply may comprise a battery and a voltage converter. The voltage supply may be external to the substrate and the substrate may further comprises at least one electrical contact arranged to be electrically connected to the voltage supply when the substrate is in the second position. The substrate further may further comprise a switch arranged to selectively electrically connect the at least one electrode to the voltage supply. The substrate may have a layer of an adherent material on a surface of the substrate which confronts the support when the substrate is in the second position. The adherent material may be a polymeric material which may be polyimide or a fluoropolymer. The substrate may have a substantially planar surface. The substrate may have a surface comprising plurality of raised portions arranged to come into contact with the support when the substrate is in the second position.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, it is instructive to present an example environment in which embodiments of the present invention may be implemented.

Figure 1:
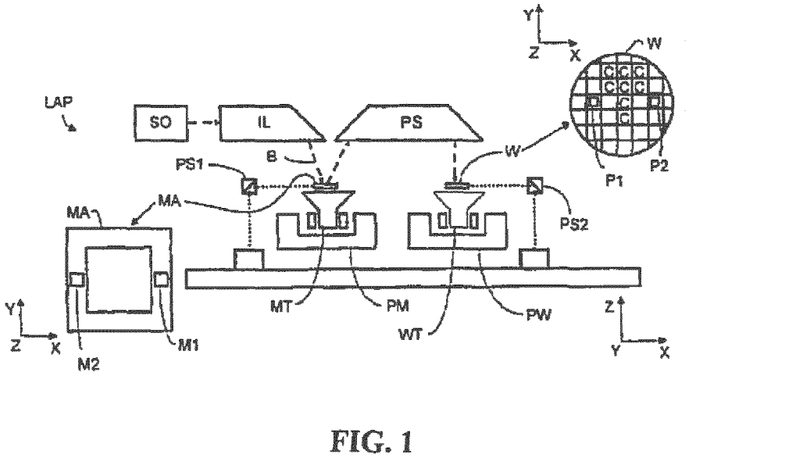
FIG. 1 shows a lithographic apparatus according to an embodiment of the present invention.

FIG. 1 schematically shows a lithographic apparatus LAP including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks Ml, M2 and substrate alignment marks P1, P2.

The depicted apparatus could be used in at least one of several modes. For example, in a step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In a scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-) magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
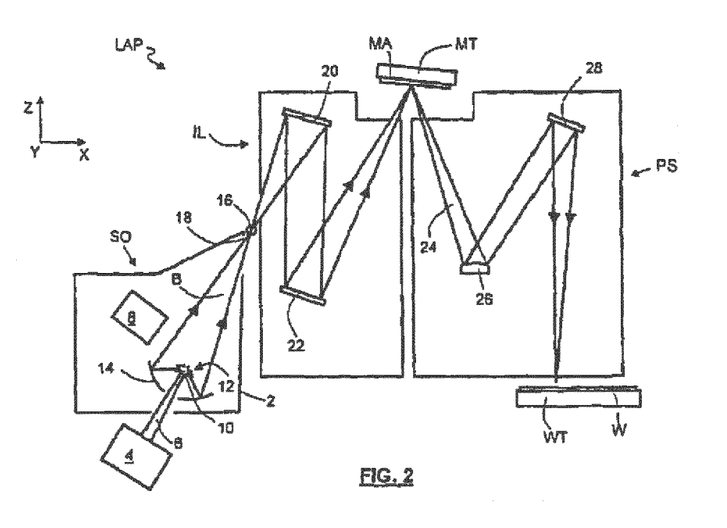
FIG. 2 is a more detailed view of the apparatus of FIG. 1, including an LPP source collector module, according to an embodiment.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a volume of fuel, such as xenon (Xe), tin (Sn) or lithium (Li) that is provided from a fuel supply 8 (sometimes referred to as a fuel stream generator). Tin, or another molten metal or intermetallic (most likely in the form of droplets) is currently thought to be the most promising and thus likely choice of fuel for EUV radiation sources. The deposition of laser energy into the fuel creates a highly ionized plasma 10 at a plasma formation location 12 that has electron temperatures of several tens of electron volts (eV). The energetic radiation generated during de-excitation and recombination of these ions is emitted from the plasma 10, collected and focused by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat or otherwise precondition the volume of fuel before the laser beam 6 is incident upon it. An LPP source that uses this approach may be referred to as a dual laser pulsing (DLP) source.

Although not shown, the fuel stream generator will comprise, or be in connection with, a nozzle configured to direct a stream of fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

Figure 3A:
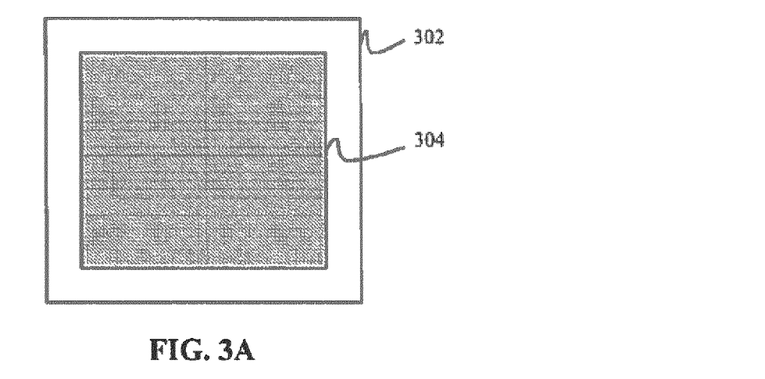
FIGS. 3A and 3B illustrate a top and side view of a first material layer applied to a backside of a patterning device, according to an embodiment.
Figure 3B:
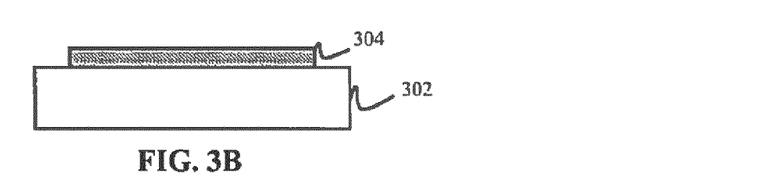

FIGS. 3A and 3B show a top view and a side view respectively of a device, specifically a patterning device 302. In one example, the patterning device is a reticle such as a reflective reticle having an array of patterned elements.

In an embodiment, patterning device 302 includes a first material layer 304 applied to a backside of patterning device 302. The backside of the patterning device may be a side that is clamped to a chuck in order to be held in place within a lithographic apparatus. In one example, the backside of the patterning device is opposite to a patterned side of the patterning device. The patterned side may also include an array of reflective elements.

First material layer 304 is a softer material than that of patterning device 302, according to an embodiment. For example, first material layer 304 may include a polymer material or a combination of various polymers and/or copolymers. Examples of materials that can be adhered to the backside of patterning device 302 include polyimide, Viton®, PTFE (polytetrafluoroethylene), or any other fluoropolymer materials.

Alternatively, first material layer 304 may comprise a sticky material such that the sticky material layer is adhered to the backside of patterning device 302. Any commercially available glue may be used as the sticky material as long as the glue does not contaminate the environment and not leave any residue on an object upon adhesion to the object.

Figure 4:
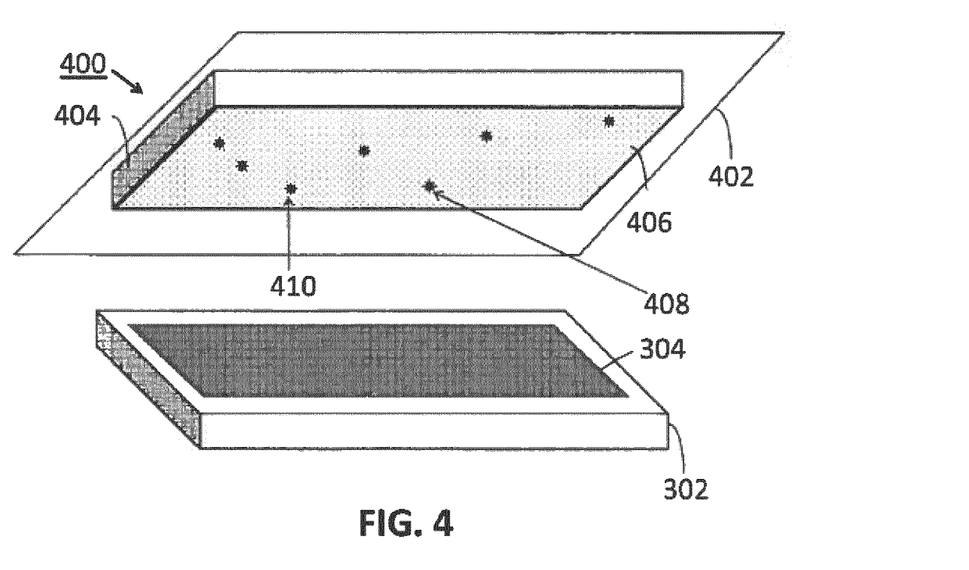
FIG. 4 illustrates a clamping structure surface, according to an embodiment.

FIG. 4 illustrates a support 400 that includes a chuck 402 and a clamping structure 404, according to an embodiment. Support 400 is designed to hold patterning device 302 in place within, for example, a lithographic apparatus. In an embodiment, clamping structure 404 includes a plurality of burls 406. The surface of burls 406 physically contact patterning device 302 or first material layer 304 during the clamping procedure. Although mechanical clamping of patterning device 302 is possible, in an embodiment, clamping structure 404 is an electrostatic clamp (ESC). As such, a voltage may be applied to the electrostatic clamp to hold patterning device 302 in place.

Also illustrated in FIG. 4 are various particles or contaminants on the surface of clamping structure 404. For example, a particle 408 may exist on a surface of clamping structure 404 between burls 406 while another particle 410 may exist on a surface of burl 406. As mentioned previously, any particles present between patterning device 302 and clamping structure 404 can cause misalignment and other patterning defects when performing any type of lithographic process. Particles such as particle 410 can be especially troublesome as they exist on a surface (e.g. burl 406) that is in direct contact with patterning device 302.

Embodiments as described herein may be used for contamination cleaning in many different lithography tools, including in an extreme ultra-violet (EUV) lithography device. EUV reticles, being reflective by nature, are very vulnerable to contamination, and are difficult to clean using manual procedures.

Reticle or wafer clamp contamination (front side and back side of the clamp) causes poor overlay, clamp damage and reticle damage. One current approach involves the use of a Reticle Table Cleaner (RTC). The RTC is a reticle with a polyamide layer on the back side of the reticle (the side that contacts the front side of the clamp) to clean contamination on the front side or face of the clamp by mechanical force (adhesion). This approach, however, cleans contamination only off of the raised portions of the front side of the clamp (the burls), and does not clean contamination off of the clamp surface between the burls. Clamp contamination between the burls currently cannot be cleaned except by a manual shift out (breaking vacuum and removing the clamp) and manual clamp wipe of the area between burls with a solvent such as isopropyl alcohol (IPA), causing days of downtime and risk to the scanner components.

According to one aspect, the disclosed subject matter involves provisioning a substrate with at least one electrode, which could be in the form of a conductive coating on the substrate, and a voltage source that will create a voltage on the electrode with respect to the face of the clamp. The substrate thus provisioned is then introduced into the chamber where the clamp is located and brought proximate to the face of the clamp. This preferably occurs with the vacuum intact. Proximate in this context means bringing the electrode close enough to the face of the clamp that the voltage difference between the electrode and the clamp is such that an electrostatic filed is created between the electrode and the clamp such that particulate contaminants on the face of the clamp experience an electrostatic force causing the particles to move from the face of the clamp to the substrate. Once the substrate is proximate the clamp, the electrode is electrically connected to the voltage source, the field between the face of the clamp and the electrode is established, and the particles move from the face of the clamp to the substrate, thus substantially cleaning the face of the clamp. The electrode is then disconnected from the voltage source and the substrate is moved away from the clamp and withdrawn from the vacuum chamber.

Thus, according to one implementation, a battery powered substrate is sued to induce a high voltage on the back side of the substrate. High in this context means that the combination of the magnitude of the width of the space between the substrate and the clamp surface and the magnitude of the voltage applied to the electrode are such that a field is created in the space that is sufficiently strong to cause particles on the clamp surface to leave the surface and adhere to the substrate. This permits in-situ electrostatic cleaning of the clamp between burls. Also, as regards clamp contamination on burl tops, it too may be more effectively cleaned by electrostatic force rather than mechanical force.

Purely for the sake of a nonlimiting example, assuming a voltage on the electrode with respect to the clamp surface in the range of about 1.5 kV to about 3 kV, the width of the space between the active portion of the substrate surface (the portion comprising the electrode or with the electrode lying beneath it) and the closest part of the clamp surface (the burl faces if burls are present) could be in the range of about 10 microns to about 50 microns.

The capability of cleaning the clamp surface in situ (that is, with the clamp in place rather than removed from the chamber and without disturbing the vacuum in the chamber in which the clamp is located) avoid the downtime penalty of removing the clamp. It also provides additional force to clean at least some types of particles on top of the burls, making it a useful adjunct to the mechanical cleaning described above.

The advantages arising from use of the disclosed subject matter may be realized for clamping structures for holding a pattering device such as a reticle as well as for clamping structures that hold the wafer that is to be processed.

It is contemplated that even though the positioning device that carries the electrostatic cleaning substrate may include an ESC, the ESC would not be energized during the cleaning process and that some alternative provision would be made for retaining the substrate in place during transport and cleaning. For example, the mass of the substrate could be selected (e.g., the substrate could be made heavier) to help keep the substrate in place without energizing the ESC.

It is contemplated that the substrate would be spaced apart from the face of the clamp to create a gap across which the particles would jump. This spacing could be uniform in the sense that the surface of the substrate that confronts the clamp surface would be substantially planar so that the distance between the burls and substrate is one value and the distance between the inter-burl valleys and the substrate is a second, greater value. Alternatively, the substrate may have raised portions, for example at its corners, that contact the clamp surface and maintain an offset between the active area of the substrate and the clamp surface. Another possibility would be to provide the surface of the substrate with a three dimensional geometry that would complement the three dimensional geometry of the clamp surface, e.g., complementary burls and inter-burl valleys. It will be appreciated that other geometries are possible and that all are within the scope of this disclosure.

As noted, it is contemplated that the electrode is electrically connected to the voltage source within the substrate after the substrate has been placed proximate to the clamp surface. The on-board voltage source may include a battery and a voltage converter. The on-board voltage source may also include a switching device that selectively connects the electrode to, and disconnects the electrode from, the voltage source. This switching device may be a mechanical switch that is manipulated by an actuator carried by the positioning device. The switching device may also be an electronic or optoelectronic switch that is operated by an interface with the lithography apparatus that provides a signal which may, for example, be electrical, electromagnetic, or optical. The switch may be set on a time delay, that is, to switch on and off after preselected intervals.

While it is contemplated that the voltage source may be incorporated into the substrate, it is also possible to provide the substrate with at least one contact electrically connected to the electrode with the contact being arranged so that it forms a connection with an external voltage supply when the substrate is in its operating position.

Figure 5:
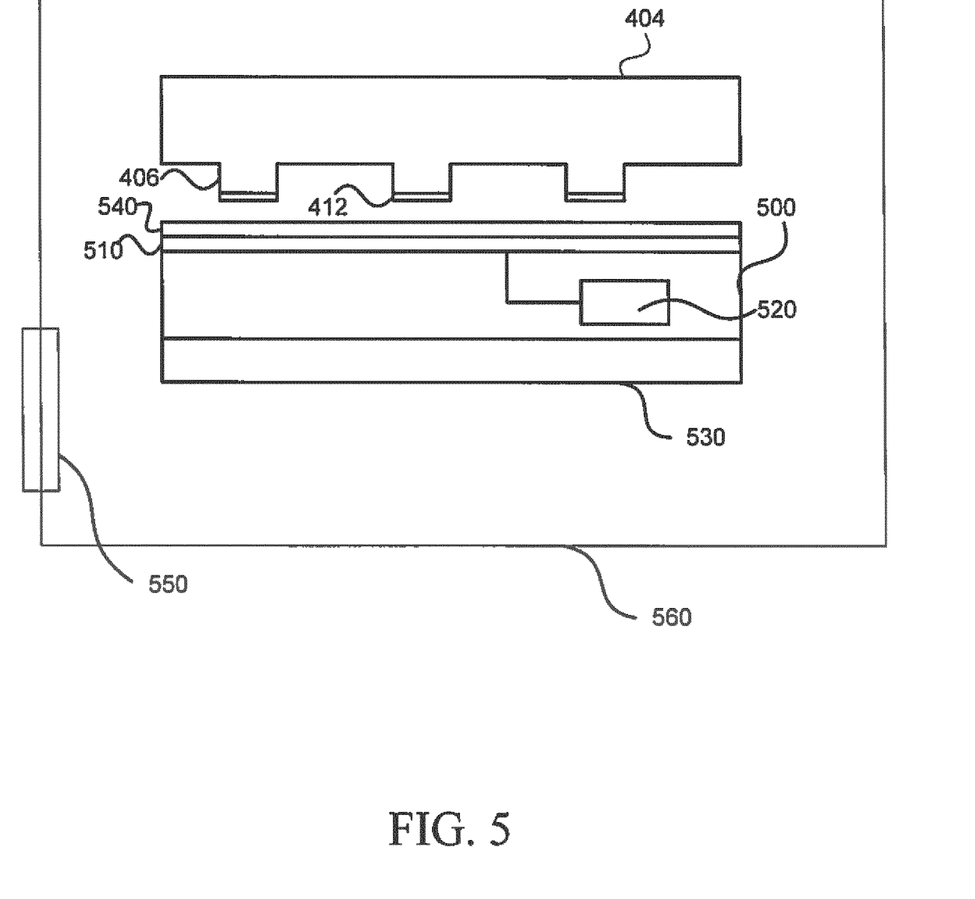
FIG. 5 illustrates an electrostatic cleaning substrate according to an embodiment.

As shown in FIG. 5, an electrostatic cleaning substrate 500 preferably includes an electrode 510 and a voltage source 520 connected to the electrode 510. FIG. 5 also shows the clamping structure 404 including burls 406. The burls 406 may be provided with a layer 412.

This layer 412 may be made of a material such as tin nitride. The electrostatic cleaning substrate 500 is carried by a positioner 530 to a position that is proximate to the clamping structure 404.

The electrode 510 may be made of any suitable conductive or semiconductive material such as chromium nitride. The electrode 510 may comprise the upper surface of the electrostatic cleaning substrate 500 or it may be lie below the upper surface of the electrostatic cleaning substrate 500. The electrode 510 may be coextensive with the upper surface of the electrostatic cleaning substrate 500 or may comprise only part of that surface or underlie only part of that surface. As shown, the electrostatic cleaning substrate 500 may also include an upper layer 540 of a material that will assist in retention of the particulate contaminants. In one example, such layers may include polyimide, Viton®, PTFE (polytetrafluoroethylene), Kapton®, and Teflon®.

The on-board voltage source 520 may comprise a battery and a voltage converter. The on-board voltage source 520 may also comprise a switching device for selectively connecting the on-board voltage source 520 to the electrode 510. The switching device may be activated, for example, by a signal transmitted by a machine interface 550 controllable from outside the vacuum chamber 560 in which the clamping structure 404 is arranged.

Figure 6A:
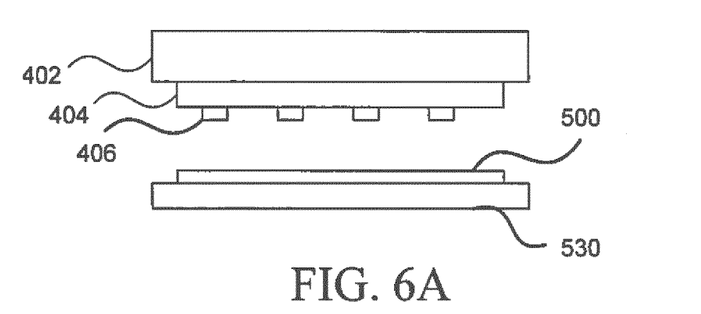
FIGS. 6A-6C illustrate a cleaning process using an electrostatic cleaning substrate according to an embodiment.
Figure 6B:
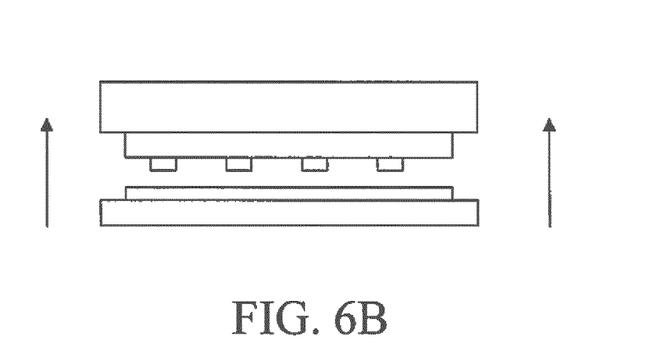
Figure 6C:
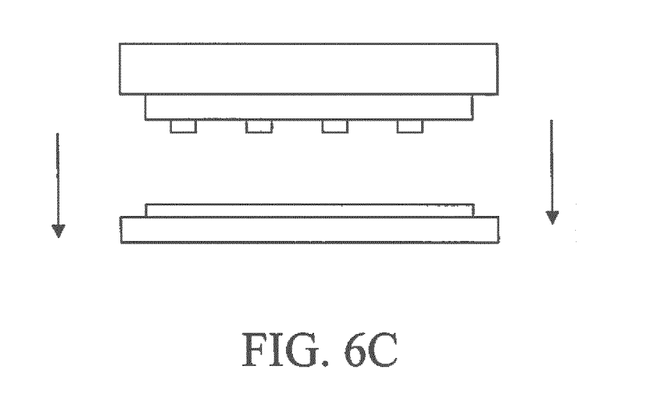

FIGS. 6A-C illustrate a particle removal process, according to an embodiment. A side view of support chuck 402 and its associated clamping device 404 is shown along with electrostatic cleaning substrate 500. In FIG. 6A, electrostatic cleaning substrate 500 is prepared to be brought into proximity with the clamping device 404.

Turning now to FIG. 6B, electrostatic cleaning substrate 500 is moved to be proximate to the clamping structure 404. The electrode in the electrostatic cleaning substrate 500 is then connected to a voltage source creating an electrostatic field in the gap between the electrostatic cleaning substrate 500 and the clamping structure 402. This causes particles on the surface of the clamping device 404 to be attracted to the electrostatic cleaning substrate 500 and to move from the clamping device 404 to the electrostatic cleaning substrate 500. The electrode in the electrostatic cleaning substrate 500 is then disconnected from the voltage source thus removing the electrostatic field in the gap between the electrostatic cleaning substrate 500 and the clamping structure 402. Turning now to FIG. 6C, electrostatic cleaning substrate 500 is moved away from clamping structure 404.

In an embodiment, each of the actions illustrated in FIGS. 6A-C can be performed automatically within, for example, a lithographic apparatus. Thus, the cleaning procedure may be performed without the need to manually clean support 400. Manual cleaning of support 400 within, for example, a lithographic apparatus, would require venting and/or disassembling of the apparatus. Additionally, the procedure may be repeated as many times as desired to continue removing any further contaminants from the surface of clamping structure 404.

Figure 7:
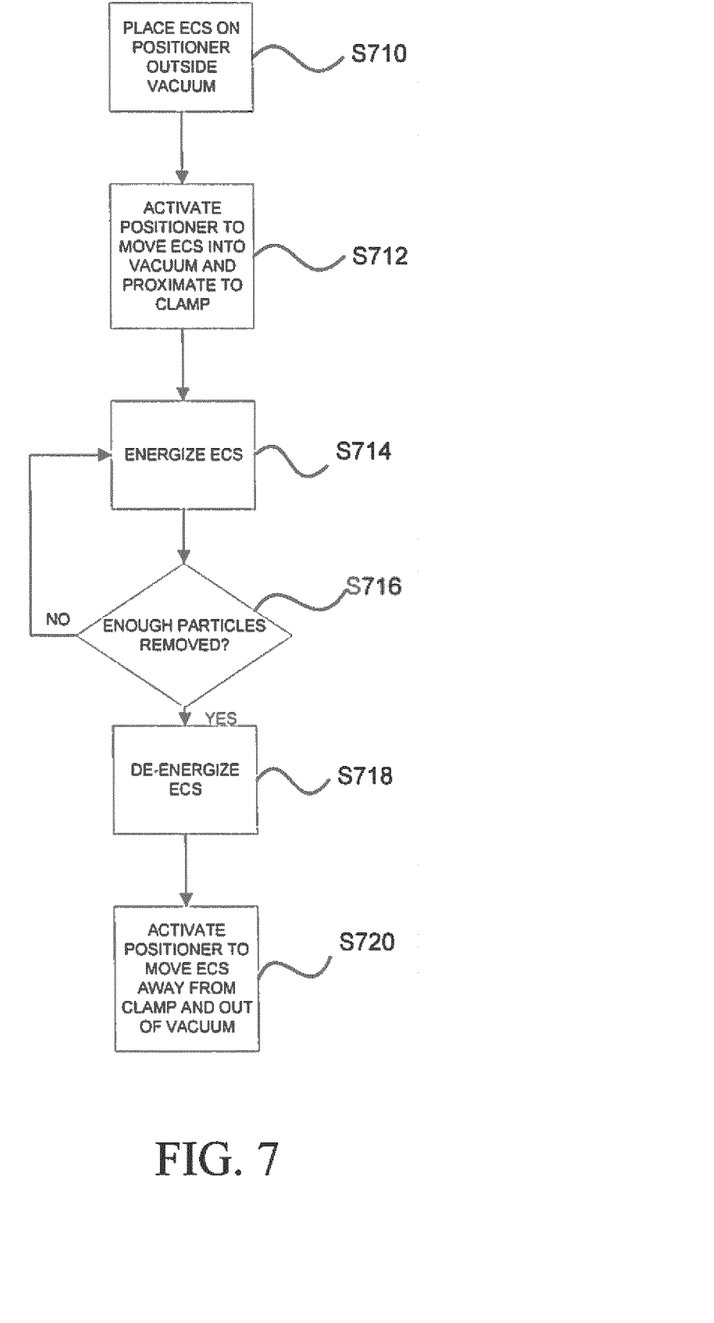
FIG. 7 is a flowchart illustrating a cleaning process using an electrostatic cleaning substrate according to an embodiment.

FIG. 7 is a flowchart Illustrating a method of using an electrostatic cleaning substrate as disclosed. In a step S710 the electrostatic cleaning substrate, Abbreviated ECS in the figure, is placed on a positioner outside of vacuum. In a step S712 the positioner moves the ECS into the vacuum and proximate the clamp. In a step S714 the ECS is energized, i.e., connected to a voltage source. In a step S716 it is determined whether enough particles of been removed from the clamp. If not enough particles have been removed, then the method reverts to step S714 and the ECS remains energized. If enough particles have been removed, then in step S718 the ECS is de-energized, i.e., disconnected from the voltage source. Then in a step S720 the positioner is activated to move the ECS away from the clamp and out of the vacuum. It should be understood that step S716 could be implemented simply by energizing the ECS for a predetermined length of time that is known a priori to be sufficient to remove enough particles or step S716 could be implemented by use of monitoring system that examines the clamping surface for particles and determines when to stop energizing the ECS based on the results of that examination.

Once the particles have been removed from clamping structure 404, electrostatic cleaning substrate 500 may be removed to have the particles cleaned off and then re-used.

The embodiments may further be described using the following clauses:

1. Apparatus comprising a substrate configured to be supported by a first support structure, the substrate comprising at least one electrode configured to generate an electrostatic field between the at least one electrode and a confronting surface of a second support structure when the first support structure brings the surface of the substrate into spaced-apart apposition with the confronting surface of the second support structure and the at least one electrode is electrically connected to a voltage supply.
2. Apparatus of clause 1 wherein the first support structure is a wafer support.
3. Apparatus of clause 1 wherein the first support structure is a reticle support.
4. Apparatus of clause 1 wherein the second support structure comprises a chuck and a clamp supported by the chuck.
5. Apparatus of clause 1 wherein the voltage supply is part of the substrate.
6. Apparatus of clause 5 wherein the voltage supply is a battery and a voltage converter.
7. Apparatus of clause 1 wherein the substrate includes a switch for selectively connecting the electrode to the voltage supply.
8. Apparatus of clause 1 wherein the at least one electrode has a total area substantially the same as a total area of the confronting surface.
9. Apparatus of clause 1 wherein surface of the substrate in proximity to the confronting surface is substantially planar.
10. Apparatus of clause 1 wherein the confronting surface has a nonplanar surface and the surface of the substrate in proximity to the confronting surface has a substantially complementary nonplanar surface.
11. Apparatus of clause 1 wherein the substrate has a layer comprises a material that is substantially nonconductive.
12. Apparatus of clause 1 wherein the substrate has a layer comprises a material that is substantially semiconductive.
13. Apparatus of clause 1 wherein the substrate has a layer of an adherent material on a surface of the substrate which confronts the confronting surface.
14. The apparatus of clause 13, wherein the adherent material is a polymeric material.
15. The apparatus of clause 14, wherein the polymeric material is polyimide or a fluoropolymer.
16. A method of removing particles from a surface of a support within a lithographic apparatus, the method comprising the steps of:
   positioning a substrate on a support structure, the substrate including at least one electrode;
   moving the support structure to a first position in which a surface of the substrate is moved into spaced-apart apposition with the surface of the support;
   cleaning the surface of the support by applying a voltage to the at least one electrode to generate an electrostatic field between the electrode and surface causing particles on the confronting surface to be attracted to the surface of the substrate; and moving the support structure to a second position in which a surface of the substrate is moved away from the surface of the support.

17. A method of clause 16 wherein the surface of the substrate is provided with a layer of an adherent material and the step of cleaning the surface by applying a voltage to the electrode to generate an electrostatic field between the at least one electrode and surface comprises causing particles on the confronting surface to be attracted to the layer of adherent material.

18. The method of clause 17, wherein the adherent material is a polymeric material.

19. The method of clause 18, wherein the polymeric material is polyimide or a fluoropolymer.

20. The method of clause 17 wherein each of the moving steps is automated.

21. The method of clause 17, wherein the support structure comprises a wafer support.

22. The method of clause 17, wherein the support structure comprises a reticle support.

23. The method of clause 17 wherein the support structure comprises an electrostatic chuck, and wherein the method does not include a step of applying a voltage to the electrostatic chuck to secure the substrate to the electrostatic chuck.

24. The method of clause 17, wherein the substrate has substantially the same total surface area as surface facing the surface of the support.

25. A lithographic apparatus comprising:
a chamber;
a positioning device configured and arranged to move an object placed on the positioning device into and out of the chamber;
a support structure positioned within the chamber;
a substrate placed on the positioning device and arranged such that the positioning device can move the substrate along a path including a first position in which the substrate is outside of the chamber and a second position in which a surface of the substrate is positioned adjacent a surface of the support structure, the substrate including at least one electrode; and
a voltage supply arranged to supply voltage to the at least one electrode when the substrate is in the second position.

26. Apparatus of clause 25 wherein the substrate comprises the voltage supply.

27. Apparatus of clause 25 wherein the voltage supply comprises a battery and a voltage converter.

28. Apparatus of clause 25 wherein the voltage supply is external to the substrate and wherein the substrate further comprises at least one electrical contact arranged to be electrically connected to the voltage supply when the substrate is in the second position.

29. Apparatus of clause 25 further in which the substrate further comprises a switch arranged to selectively electrically connect the at least one electrode to the voltage supply.

30. Apparatus of clause 25 wherein the substrate has a layer of an adherent material on a surface of the substrate which confronts the support when the substrate is in the second position.

31. The apparatus of clause 30, wherein the adherent material is a polymeric material.

32. The apparatus of clause 31, wherein the polymeric material is polyimide or a fluoropolymer.

33. The apparatus of clause 25, wherein the substrate has a substantially planar surface.

34. The apparatus of clause 25, wherein the substrate has a surface comprising plurality of raised portions arranged to come into contact with the support when the substrate is in the second position.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the present invention have been described above, it will be appreciated that the present invention may be practiced otherwise than as described. The descriptions above are intended to be illustrative, not limiting. Thus it will be apparent to one skilled in the art that modifications may be made to the present invention as described without departing from the scope of the claims that follow.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus comprising:
a substrate configured to be supported by a first support structure, the substrate comprising:
at least one electrode configured to generate an electrostatic field between the at least one electrode and a confronting surface of a second support structure when the first support structure brings the surface of the substrate into spaced-apart apposition with the confronting surface of the second support structure;
wherein the at least one electrode is electrically connected to a voltage supply; and
wherein the confronting surface comprises a plurality of burls; and
wherein the surface of the substrate comprises a plurality of valleys complementary to the plurality of burls.

2. The apparatus of claim 1, wherein the first support structure is a wafer support.

3. The apparatus of claim 1, wherein the first support structure is a reticle support.

4. The apparatus of claim 1, wherein the second support structure comprises a chuck and a clamp supported by the chuck.

5. The apparatus of claim 1, wherein the voltage supply is part of the substrate.

6. The apparatus of claim 5, wherein the voltage supply is a battery and a voltage converter.

7. The apparatus of claim 1, wherein the substrate includes a switch for selectively connecting the electrode to the voltage supply.

8. The apparatus of claim 1, wherein the at least one electrode has a total area substantially the same as a total area of the confronting surface.

9. The apparatus of claim 1, wherein the substrate has a layer comprising a material that is substantially nonconductive.

10. The apparatus of claim 1, wherein the substrate has a layer comprising a material that is substantially semiconductive.

11. The apparatus of claim 1, wherein the substrate has a layer of an adherent material on a surface of the substrate which confronts the confronting surface.

12. The apparatus of claim 11, wherein the adherent material is a polymeric material.

13. The apparatus of claim 12, wherein the polymeric material is polyimide or a fluoropolymer.

14. A lithographic apparatus comprising:
a chamber;
a positioning device configured and arranged to move an object placed on the positioning device into and out of the chamber;
a support structure positioned within the chamber;
a substrate placed on the positioning device and arranged such that the positioning device is configured to move the substrate along a path including a first position in which the substrate is outside of the chamber and a second position in which a surface of the substrate is positioned adjacent a surface of the support structure, the substrate including at least one electrode configured to generate an electrostatic field between the at least one electrode and the surface of the support structure when the positioning device brings the surface of the substrate into spaced-apart apposition with the surface of the support structure, wherein the surface of the support structure comprises a plurality of burls, and wherein the surface of the substrate comprises a plurality of valleys complementary to the plurality of burls; and
a voltage supply arranged to supply voltage to the at least one electrode when the substrate is in the second position.

15. The lithographic apparatus of claim 14, wherein the substrate comprises the voltage supply.

16. The lithographic apparatus of claim 14, wherein the voltage supply comprises a battery and a voltage converter.

17. The lithographic apparatus of claim 14, wherein the voltage supply is external to the substrate and wherein the substrate further comprises at least one electrical contact arranged to be electrically connected to the voltage supply when the substrate is in the second position.

18. The lithographic apparatus of claim 14, wherein the substrate further comprises a switch arranged to selectively electrically connect the at least one electrode to the voltage supply.

19. The lithographic apparatus of claim 14, wherein the substrate has a layer of an adherent material on a surface of the substrate which confronts the support when the substrate is in the second position.

20. The lithographic apparatus of claim 19, wherein the adherent material is a polymeric material.

21. The lithographic apparatus of claim 20, wherein the polymeric material is polyimide or a fluoropolymer.

22. The lithographic apparatus of claim 14, wherein the substrate has a surface comprising a plurality of raised portions arranged to come into contact with the support when the substrate is in the second position.

* * * * *

UNITED STATES PATENT AND TRADEMARK OFFICE
CERTIFICATE OF CORRECTION

PATENT NO. : 11,048,175 B2
APPLICATION NO. : 16/642927
DATED : June 29, 2021
INVENTOR(S) : Perez-Falcon et al.

Page 1 of 1

It is certified that error appears in the above-identified patent and that said Letters Patent is hereby corrected as shown below:

In the Claims

In Column 15, Line 16, Claim 1 replace "a voltage supply; and" with --a voltage supply;--.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*